United States Patent
Kelly et al.

(10) Patent No.: US 10,950,654 B2
(45) Date of Patent: Mar. 16, 2021

(54) INTEGRATING CIRCUIT ELEMENTS IN A STACKED QUANTUM COMPUTING DEVICE

(71) Applicant: Google LLC, Mountain View, CA (US)

(72) Inventors: Julian Shaw Kelly, Santa Barbara, CA (US); Joshua Yousouf Mutus, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 10 days.

(21) Appl. No.: 16/487,555

(22) PCT Filed: Dec. 12, 2017

(86) PCT No.: PCT/US2017/065668
§ 371 (c)(1),
(2) Date: Aug. 21, 2019

(87) PCT Pub. No.: WO2018/169579
PCT Pub. Date: Sep. 20, 2018

(65) Prior Publication Data
US 2020/0058702 A1 Feb. 20, 2020

Related U.S. Application Data

(60) Provisional application No. 62/470,670, filed on Mar. 13, 2017.

(51) Int. Cl.
*H01L 27/18* (2006.01)
*H01L 25/065* (2006.01)
*G06N 10/00* (2019.01)

(52) U.S. Cl.
CPC ............ *H01L 27/18* (2013.01); *G06N 10/00* (2019.01); *H01L 25/0657* (2013.01); *H01L 2225/06513* (2013.01)

(58) Field of Classification Search
CPC ................ H01L 27/18; H01L 25/0657; H01L 2225/06513; G06N 10/00
USPC .......................................................... 257/31
See application file for complete search history.

(56) References Cited

U.S. PATENT DOCUMENTS

| | | | | |
|---|---|---|---|---|
| 10,217,057 | B2* | 2/2019 | Barends | G06N 20/00 |
| 10,305,015 | B1* | 5/2019 | Brink | H01L 27/18 |
| 2018/0013052 | A1* | 1/2018 | Oliver | H01L 25/0652 |
| 2019/0165238 | A1* | 5/2019 | Rosenblatt | H01L 39/045 |
| 2019/0229094 | A1* | 7/2019 | White | H01L 24/05 |

(Continued)

OTHER PUBLICATIONS

Kelly et al, "State preservation by repetitive error detection in a superconducting quantum circuit" University of California Santa Barbara, 2014, 30 pages.

(Continued)

*Primary Examiner* — Igwe U Anya
(74) *Attorney, Agent, or Firm* — Fish & Richardson P.C.

(57) ABSTRACT

A stacked quantum computing device including: a first chip including a superconducting qubit, where the superconducting qubit includes a superconducting quantum interference device (SQUID) region, a control region, and a readout region, and a second chip bonded to the first chip, where the second chip includes a first control element overlapping with the SQUID region, a second control element displaced laterally from the control region and without overlapping the control region, and a readout device overlapping the readout region.

20 Claims, 10 Drawing Sheets

(56) References Cited

U.S. PATENT DOCUMENTS

2020/0012961 A1* 1/2020 Kelly ...................... H01L 39/14

OTHER PUBLICATIONS

Kelly, "Fault-tolerant superconducting qubits" Thesis for the degree of Doctor of Philosophy, University of California Santa Barbara, Mar. 2015.
PCT International Search Report and Written Opinion in International Application No. PCT/US2017/065668, dated Mar. 12, 2018, 16 pages.
Versluis et al, "Scalable quantum circuit and control for a superconducting surface code" arXiv, Dec. 2016, 9 pages.
EP Office Action in European Appln. No. 17822920.9, dated Sep. 18, 2020, 8 pages.
PCT International Preliminary Report on Patentability issued in International Application No. PCT/US2017/065668, dated Sep. 26, 2019, 11 pages.
AU Office Action in Australian Appln. No. 2017404530, dated Apr. 16, 2020, 3 pages.
AU Office Action in Australian Appln. No. 2020217399, dated Jan. 5, 2021, 5 pages.

* cited by examiner

INTEGRATING CIRCUIT ELEMENTS IN A STACKED QUANTUM COMPUTING DEVICE

This application is a national stage application under 35 U.S.C. § 371 of PCT International Application No. PCT/US2017/065668, filed Dec. 12, 2017, which claims the benefit of U.S. Provisional Application Ser. No. 62/470,670, filed Mar. 13, 2017. The contents of the foregoing applications are hereby incorporated by reference.

TECHNICAL HELD

The present disclosure relates to integrating circuit elements in stacked quantum computing devices.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|\rangle$ state, whereas the value $|\beta|^2$ represents the probability that a qubit is in the $|1\rangle$ basis state.

SUMMARY

In general, in some aspects, the present disclosure relates to one or more devices that include a first chip including a superconducting qubit, where the superconducting qubit includes a superconducting quantum interference device (SQUID) region, a control region, and a readout region, and a second chip bonded to the first chip, where the second chip includes a first control element overlapping with the SQUID region, a second control element displaced laterally from the control region and without overlapping the control region, and a readout device overlapping the readout region.

Implementations of the devices can include one or more of the following features. For example, in some implementations, the readout device includes a resonator element and a pad element, where the resonator element is electrically coupled to a pad element, and the pad element overlaps the readout region without the resonator overlapping the readout region.

In some implementations, the pad element is symmetrically aligned with the readout region.

In some implementations, a surface area of the readout region facing the second chip and overlapped by the pad element is less than a surface area of the pad element facing the first chip.

In some implementations, the pad element is operable to capacitively couple to the readout region.

In some implementations, the first chip includes a superconductor ground plane with an edge aligned with the control region of the superconducting qubit, such that the edge includes a recessed region where a portion of the superconductor ground plane is removed and where the control element is aligned over the recessed region.

In some implementations, a surface area of the second control element facing the first chip is less than a surface area of the recessed region facing the second chip.

In some implementations, the second control element is operable to capacitively couple to the control region.

In some implementations, the second element is operable to excite the superconducting qubit.

In some implementations, the first control element includes a bias coil, where the bias coil includes a layer of superconductor material arranged in a loop, and where the SQUID region includes a SQUID arranged in a ring.

In some implementations, the loop includes an inner loop edge and an outer loop edge, where the inner loop edge is aligned within an inner area of the ring, and the outer loop edge is aligned outside the inner area of the ring.

In some implementations, a lateral distance between the inner loop edge and an edge of the ring defining the inner area of the ring is at least 2 microns, and a lateral distance between the outer loop edge and the edge of the ring defined by the inner area of the ring is at least 2 microns.

In some implementations, the loop includes an inner loop edge and an outer loop edge, where the outer loop edge is aligned within an inner area of the ring.

In some implementations, a lateral distance between the outer loop edge and an edge of the ring defining the inner area of the ring is at least 2 microns.

In some implementations, the first control element is operable to tune the superconducting qubit.

In some implementations, the first control element is operable to inductively couple to the SQUID region.

In some implementations, the first chip is bump bonded to the second chip.

In some implementations, there is a gap between the first chip and the second chip, where a height of the gap between the first chip and the second chip is 1-10 microns.

In some implementations, the first control element, the second control element, and the readout device include superconductor material.

In some implementations, the superconducting qubit is a transmon qubit, a flux qubit, or a gmon qubit.

In general, in some aspects, the subject matter of the present disclosure may be embodied in methods of operating a quantum computational system, in which operating the quantum computational system includes operating a quantum computing device. The quantum computing device includes, e.g., a first chip including a superconducting qubit, where the superconducting qubit includes a SQUID region, a control region, and a readout region, and a second chip bonded to the first chip, where the second chip includes a first control element overlapping with the SQUID region, a second control element displaced laterally from the control region and without overlapping the control region, and a readout device overlapping the readout region. Operating the quantum computing device can include using the quantum computing device to coherently process quantum information stored in the superconducting qubit. Operating the quantum computational system may further include obtaining an output from the quantum computational system, and processing the output using classical circuit elements.

Particular embodiments of the subject matter described in this specification can be implemented to realize one or more of the following advantages. For example, in some embodiments, devices and methods disclosed herein increase chip misalignment tolerance to preserve qubit coherence and qubit coupling strength, while reducing stray coupling effects in a stacked quantum computing device (e.g., a flip-chip architecture). Additionally, in some embodiments, the devices and methods disclosed herein allow an increase in qubit density (e.g., from one-dimensional chains of superconducting qubits to two-dimensional arrays of superconducting qubits) and/or an increase in qubit coupling through 3D integration. Moreover, in some embodiments, the devices and methods disclosed herein can reduce energy loss and dissipation in quantum circuit elements that may be caused by deposited dielectric materials.

The details of one or more embodiments are set forth in the accompanying drawings and the description below. Other features and advantages will be apparent from the description, drawings, and the claims.

DETAILED DESCRIPTION

Figure 1:
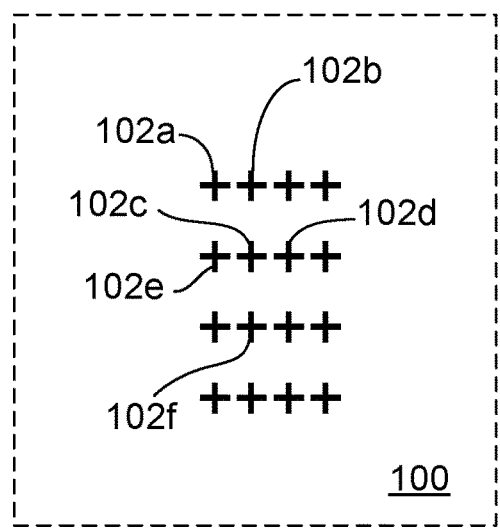
FIG. 1 is a schematic illustrating an example of two-dimensional array of qubits.

Quantum computing entails coherently processing quantum information stored in the quantum bits (qubits) of a quantum computer. Superconducting quantum computing is a promising implementation of quantum computing technology in which quantum computing circuit elements are formed, in part, from superconductor materials. Superconducting quantum computers are typically multilevel systems, in which only the first two levels are used as the computational basis. In certain implementations, quantum circuit elements e.g., quantum computing circuit elements), such as qubits, are operated at very low temperatures so that superconductivity can be achieved and so that thermal fluctuations do not cause transitions between energy levels. Additionally, it may be preferable that the quantum computing circuit elements are operated with low energy loss and dissipation (e.g., the quantum computing circuit elements exhibit a high quality factor, Q). Low energy loss and dissipation may help to avoid, e.g., quantum decoherence.

In certain types of quantum computing processors, such as quantum annealers, the qubits of the quantum processor are operatively coupled together in a controllable manner such that the quantum state of each qubit affects the corresponding quantum states of the other qubits to which it is coupled. Depending on the processor design, the chosen architecture may limit the density and total number of qubits available for coupling, and thus limit the ability of the processor to perform complex problems requiring large numbers of qubits. Furthermore, in certain quantum computing designs, the qubits may suffer energy loss and decoherence due to interactions with two level systems. The two-level systems (TLS) are material defects inherently present in a dielectric substrate, originating from the tunnelling between two configurations of atoms within the dielectric substrate, or in some implementations at the interface between material layers. For instance, in quantum computers that use qubits formed from superconductor materials, the presence of lossy non-superconductor materials from, e.g., deposited dielectrics, classical circuit elements with which the quantum computers communicate, and from the connections between the classical circuit elements and the quantum circuit elements can lead to increased decoherence. To increase qubit density and expand the number of qubits available for coupling in a quantum processor, such as a quantum annealer having superconductor quantum circuit elements, the processor and associated circuit elements can be constructed using 3D integration. That is, instead of fabricating the quantum circuit elements of the processor within a single plane of a chip that extends along one and/or two dimensions (e.g., x- and/or y-directions), the quantum circuit elements can also be formed in multiple chips that are coupled together along a third dimension (e.g., z-direction). An approach for achieving 3D integration, without introducing lossy processing/dielectrics, is to couple the chips using bump bonding. In Which the chips are joined to one another by, e.g., superconductor bump bonds. In some implementations, bump bonds may be used to electrically couple together components from the different chips in addition to physical coupling of the chips. Alternatively, bump bonds solely may be used to provide physical coupling of different chips together. By using superconductor bump bonds for coupling, it is possible to achieve a reduction in the energy loss and decoherence that can otherwise occur with lossy non-superconductor materials.

Alignment is a challenge in the fabrication process of a stacked quantum computing device, specifically between interacting elements located on separate chips, which can be electrically and mechanically connected through the use of bump bonds.

The present disclosure relates to devices and methods for coupling stacked quantum computing devices. In particular, in some implementations, the present disclosure relates to providing multiple chips arranged in a stack, in which a first chip in the stack includes a two-dimensional array of qubits and at least a second chip in the stack includes control elements for coupling to the qubits in the first chip.

FIG. 1 is a schematic illustrating an example of a two-dimensional array of superconducting qubits 100. The array of superconducting qubits 100 may be a part of a quantum computational system (e.g., a quantum annealer) for performing quantum computing operations. In the example shown in FIG. 1, each superconducting qubit is an xenon qubit, illustrated generally in the shape of a "plus" sign having four arms. Qubits 100 may include, but are not limited to, other types of qubits such as flux qubits, transmon qubits, and gmon qubits. FIG. 1 depicts a four-by-four array of superconducting qubits 100, but any number of qubits may be implemented in a one-dimensional (1D) or two-dimensional (2D) array. Operating a quantum computational system that includes an array of superconducting qubits, such as the array of superconducting qubits 100, entails, in some implementations, coupling the superconducting qubits of the array together. For instance, nearest neighbor qubits 102a and 102b may couple to one another through their neighboring arms. Similarly, each of the inner qubits (e.g., obits 102c and 102d) in the 2D array may directly couple to four nearest neighbor qubits. For example, qubit 102c may couple with qubits 102b, 102d, 102e, and 102f.

With increasing the number of qubits in a 2D array, coupling to the cubits rapidly becomes very challenging. For instance, in a qubit array, such as array 100, each inner qubit may be required to make 7 separate connections (e.g., 4 connections to each nearest neighbor qubit and 3 connections for readout control. Z-control and XY-control) As the number of qubits within the array increases, the space for providing wiring decreases. One option is to wire the qubits using traditional complementary metal-oxide-semiconductor (CMOS) techniques, such as forming the wiring in multiple layers of deposited dielectrics. However, such dielectrics are associated with high loss that causes qubits to decohere.

Another approach to address qubit wiring is to locate the wiring and other control elements on a separate chip that is coupled to a chip that contains the qubits. For example, wiring for the respective control elements (e.g., Z-control and XY-control) and a readout resonator for each superconducting qubit in array 100 can be moved from a chip on which the qubits are formed to a separate second chip. In some implementations, the first chip containing the qubit array 100 is electrically and mechanically connected to the second chip containing wiring and qubit control elements using, e.g., superconductor bump bonds such as indium.

Figure 2:
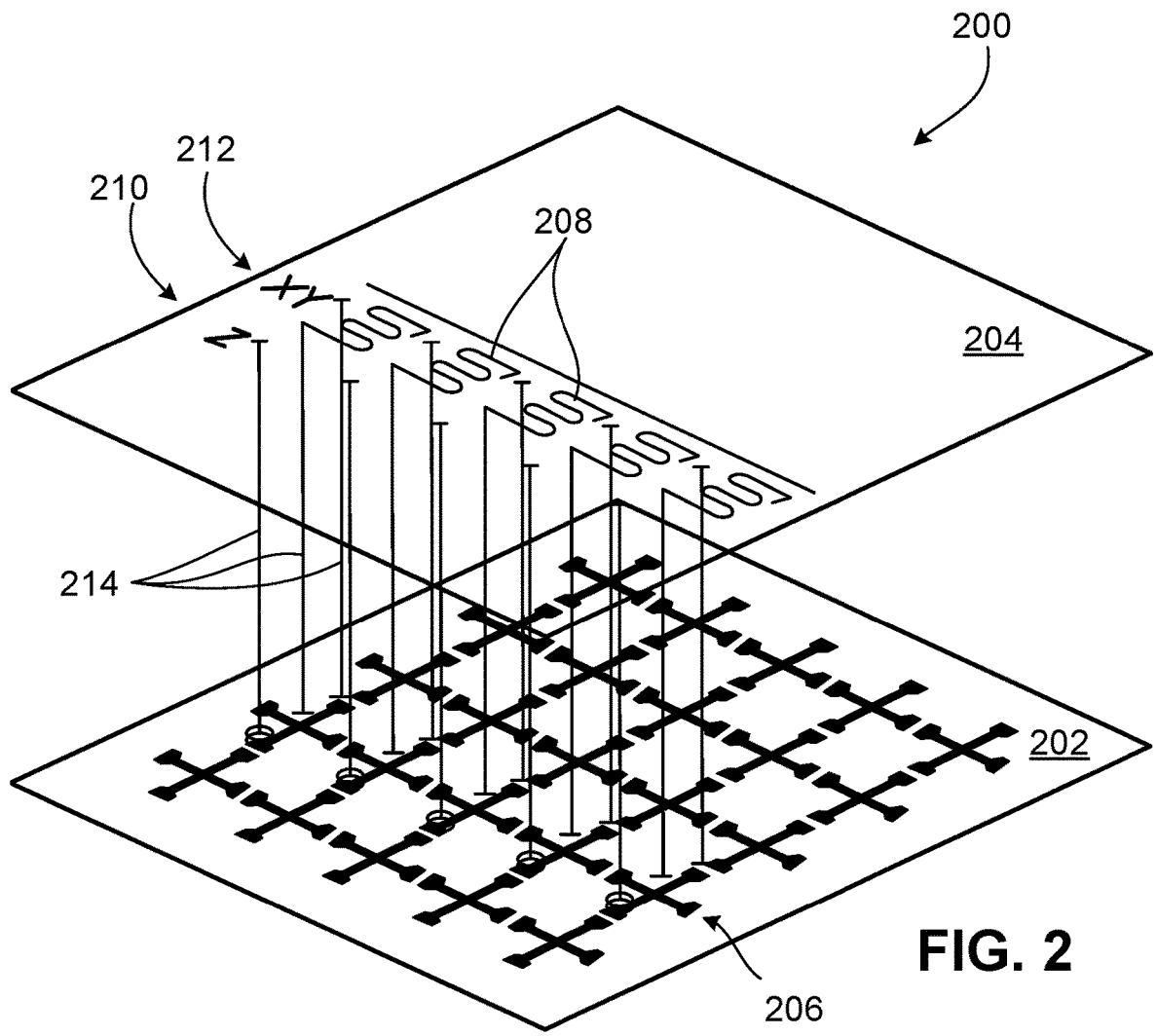
FIG. 2 is a schematic illustrating an example of a stacked quantum computing device including a first chip and a second chip.

FIG. 2 is a schematic illustrating an example of a stacked quantum computing device 200 including a first chip 202 and a second chip 204. The first chip 202 includes a two-dimensional array 206 of superconducting qubits. Each superconducting qubit in the example array 206 is an xenon qubit, though other qubits may be used instead. The second chip 204 includes readout device 208 and control elements 210, 212. Each of the first chip 202 and the second chip 204 may also include one or more circuit elements for performing data processing operations.

The superconducting qubits of the first chip 202 may be formed on a substrate. The substrate of the first chip may be formed from, e.g., a low loss and single crystalline dielectric, such as a silicon or sapphire wafer. A low loss dielectric can be defined, in part, by having a small loss tangent at microwave frequencies (1-10 GHz) at or less than 1e-5. Other materials may be used for the substrate instead.

The readout device 208 of the second chip 204 may include, for example, readout resonators. The control elements 210, 212 may include, e.g., a first control element 210 (e.g., Z-control) and a second control element 212 (e.g., XY-control). A superconducting qubit Z-control element is operable to tune an operating frequency of a superconducting qubit to which the control element is coupled upon application of a control pulse to the Z-control element. A superconducting qubit XY-control element is operable to excite a superconducting qubit to which the XY-control element is coupled, upon application of a control signal to the XY-control element. A readout device is operable to readout a state of a superconducting qubit to which the readout device is capacitively coupled by probing the frequency of the resonator element.

Similar to the first chip 202, the second chip 204 also may include a substrate formed from a low loss dielectric material suitable for quantum circuits, such as single crystalline silicon or sapphire. The thickness of the substrate may be between, e.g., approximately 10 microns and approximately 1000 microns.

The first chip 202 may be bonded electrically and/or mechanically to the second chip through bonds 214 (e.g., bump bonds).

Figure 3A:
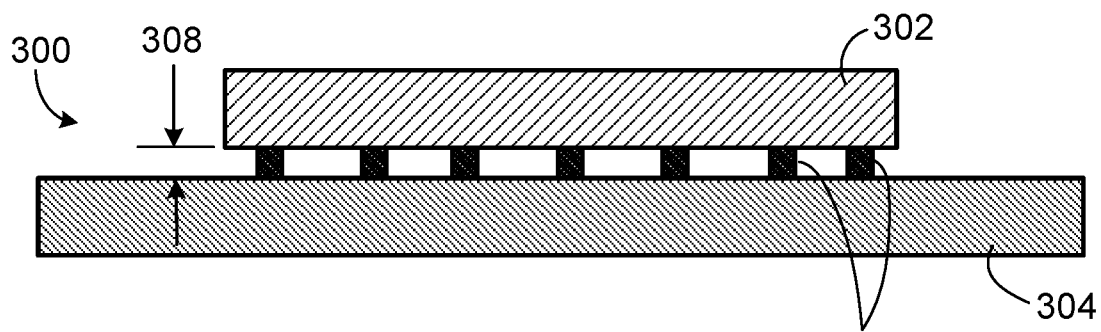
FIGS. 3A-3B are schematics illustrating different views of an example stacked quantum computing device.
Figure 3B:
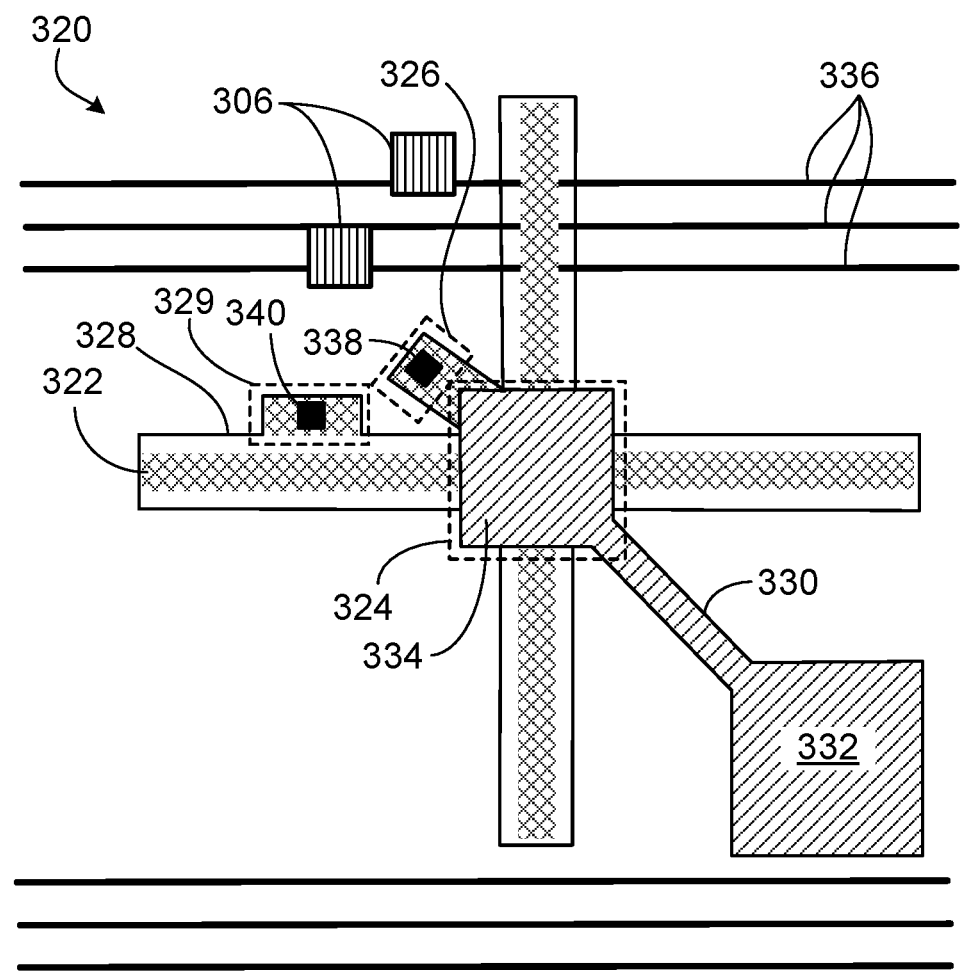

FIGS. 3A-3B are schematics illustrating different views of an example of a stacked quantum computing device. FIG. 3A shows a cross-sectional view of a stacked quantum computing device 300 of a first chip 302 aligned on top of a second chip 304 and connected electrically and/or mechanically using bump bonds 306. The bump bonds 306 may include superconductor material to avoid energy loss and decoherence of qubits that may be located, e.g., on the first chip 302. For instance, suitable superconductor material for use as a bump bond 306 includes, but is not limited to, indium, lead, rhenium, palladium, or niobium having a thin layer of gold.

The thickness of the bump bonds 306 may be set so that the first chip 302 and the second chip 304 are spaced at a gap 308 apart. The approximate height of the gap 308 may be within an uncertainty based on the accuracy and/or precision limitations of the deposition technique(s) used to deposit and/or remove material to form the bump bonds 306 (and/or other components that may affect the distance) as well as of the metrology technique(s) with which the height of the gap is measured. In some implementations, the height of the gap between the first chip 302 and the second chip 304 is at least 5 microns.

FIG. 3B shows a schematic illustrating a top-view through the second chip 304 of a stacked quantum computing device layout 320 where the second chip 304 is aligned over the first chip 302. The first chip 302 includes a superconducting qubit 322, which includes a readout region 324, a superconducting quantum interface device (SQUID) region 326, and a control region 328. The readout region 324 of the superconducting qubit 322 corresponds to an area of the superconducting qubit 322 defined around a center of the superconducting qubit 322, and follows the outline of the central portion of the superconducting qubit 322 within the dashed outline. For example, with respect to the example shown in FIG. 3B, superconducting qubit 322 is an Xmon style qubit exhibiting a cross-like shape having four long arms, and additionally including a portion of a shorter arm in the upper-left quadrant branching out from the center of the superconducting qubit 322 (e.g., corresponding to the SQUID loop of the superconducting qubit). The readout region 324 can be shaped to cover the area of the superconducting qubit 322 when the first chip and the second chip are aligned with respect to one another including a central portion, a portion of each of the four arms, and optionally including a portion of the branch corresponding to the SQUID loop of the superconducting qubit 322. Readout region 324 is discussed in more detail with reference to FIGS. 4A-C below.

The SQUID region 326 of the superconducting qubit 322 corresponds to an area of the superconducting qubit 322 including a portion of the shorter arm in the upper left quadrant branching out of the center (e.g., corresponding to the SQUID loop) of the superconducting qubit 322 within the dashed outline. SQUID region 326 is discussed in more detail with reference to FIGS. 5A-C below.

The control region 328 of the superconducting qubit 322 corresponds to an area of the superconducting qubit 322 (e.g., including a portion of one arm of the superconducting qubit 322). The control region 328 is adjacent to a recessed region 329 which is formed within an edge of the ground plane that faces the control region 328, where a "tab" potion of the superconductor ground plane that has been removed directly adjacent to the superconducting qubit 322. For example, with respect to the example shown in FIG. 3B, superconducting qubit 322 is an Xmon style qubit and where recessed region 329 is a portion of the superconductor ground plane adjacent to one of the arms of the superconducting qubit 322 that has been removed. The control region 328 and the recessed region 329 are discussed in more detail with reference to FIGS. 6A-C below.

Though qubit 322 is shown as an Inion style qubit, other qubits may be used instead, each of which also include a corresponding readout region, SQUID region and control region as detailed herein.

The second chip 304 includes a readout device 330, the readout device including a resonator element 332 electrically coupled to a pad element 334. The second chip 304 can also include wiring elements 336. Bump bonds (e.g., 306) contact the first chip 302 and the second chip 304. Additionally, the second chip 304 can include a first control element 338 (e.g., a Z-control element and a second control element 340 (e.g., an XV control element).

In some implementations, the pad element 334 on the second chip 304 is oriented on the second chip 304 such that when the first chip 302 and the second chip 304 are aligned (e.g., as seen in FIG. 3A), the pad element 334 is symmetrically aligned with the readout region 324 of a corresponding superconducting qubit 322 on the first chip 302 such that the pad element 334 can electromagnetically couple (e.g., capacitively) to the readout region 330 of the second chip. In some implementations, if the pad element 334 and the readout region 324 are of the same shape, they can be symmetrically aligned such that their centers coincide with one another and their edges (or, when the edges are curved, the tangents to their edges) are disposed substantially parallel to one another. Additionally, the resonator element 332 of the readout device 330 on the second chip 304 is oriented on the second chip 304 such that when the first chip 302 and the second chip 304 are aligned (e.g., as seen in FIG. 3A), superconducting qubit 322 on the first chip 302 is not located directly underneath the resonator element 332. More detail of the readout device is discussed with reference to FIGS. 4A-C.

In some implementations, the first control element 338 is arranged on the second chip 304 so that the SQUID region 326 of the superconducting qubit 322 on the first chip 302 is aligned directly underneath with respect to the first control element 338 on the second chip 304. By positioning the SQUID region 326 directly beneath the first control element 338, the first control element 338 can electromagnetically couple (e.g., inductively) couple to the qubit through the SQUID region 326. The alignment of the SQUID region 326 with respect to the first control element 338 is discussed in more detail with reference to FIG. 5C below.

In some implementations, the second control element 340 is arranged on the second chip 304 so that the second control element 340 is displaced laterally from and does not overlap the control region 328 of the superconducting qubit. Rather, the second control element 340 is aligned over the recessed region 329 of the superconducting qubit 322 on the first chip 302. By positioning the recessed region 329 directly beneath the second control element 340 and displacing the second control element 340 from the control region 328, the second control element 340 can electromagnetically couple (e.g., by mutual capacitance of the fringing fields) to the qubit through the control region 328. The alignment of the control region 328 with respect to the second control element 340 is discussed in more detail with reference to FIG. 6C below.

In some implementations, the gap 308 between a first chip 302 and a second chip 304, as depicted in FIG. 3A, is set to achieve a desired capacitive or inductive coupling between circuit elements on the first chip 302 and on the second chip 304 (e.g., a readout region 324 of a superconducting qubit 322 on the first chip 302 and a readout device 330 on the second chip 304)

For example, a height of the gap 308 between the device surface of the first chip 302 and the structural element surface of the second chip 304 may be set to be between approximately 0.5 µm and approximately 100 µm (e.g., between approximately 10 µm and approximately 20 µm, between approximately 1 µm and 10 µm, between approximately 0.5 µm and approximately 20 µm, between approximately 0.5 µm and approximately 15 µm, between approximately 0.5 µm and approximately 10 µm, between approximately 0.5 µm and approximately 5 µm, or between approximately 0.5 µm and approximately 2.5 µm).

Figure 3C:
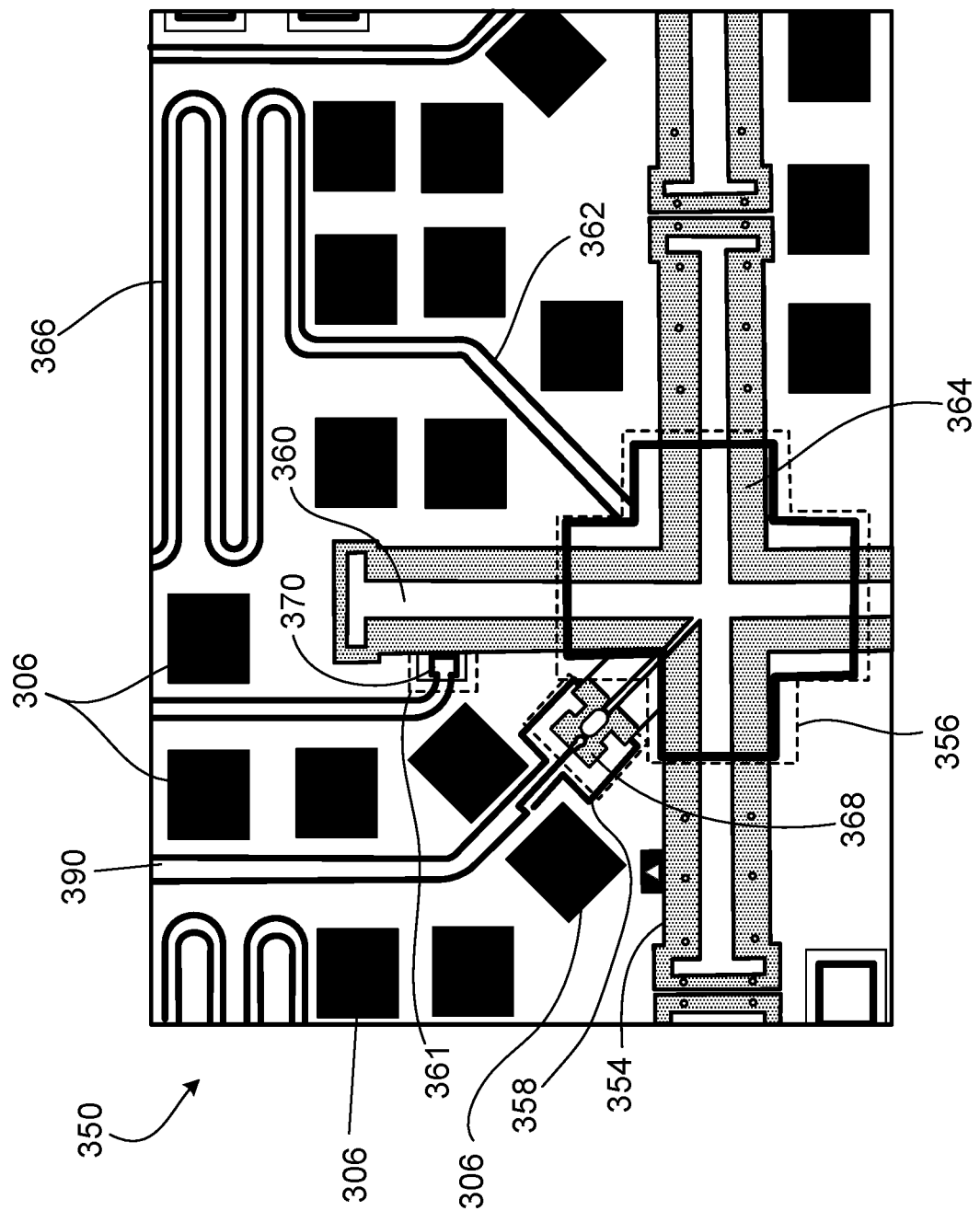
FIG. 3C is a schematic illustrating a top-view through a second chip of a stacked quantum computing device.

FIG. 3C is a schematic illustrating a top-view 350 through a second chip of a stacked quantum computing device, where a second chip 304 is aligned to a first chip 302 with bump bonds (e.g., superconductor bump bonds 306) bonding the two chips together. In the schematic of FIG. 3C, the white regions correspond to superconductor material, the shaded regions correspond to an exposed surface of the substrate. In the schematic of FIG. 3C the superconductor layer and substrate of the second chip 304 are transparent and respective circuit elements on the second chip 304 are depicted as outlines defined by the regions where the substrate of the second chip is exposed (e.g., regions where the superconductor layer has been removed) only.

The first chip 302 includes a superconducting qubit 354, where the white regions correspond to superconductor material (e.g., aluminum) and the dark regions correspond to exposed surface of the substrate (e.g., dielectric substrate). The superconducting qubit 354 depicted in FIG. 3C is an Xmon type superconducting qubit. Other qubit types, for example, gmon, fluxmon, or transmon qubits may be used instead. A readout region 356, a SQUID region 358, and a recessed region 361 adjacent to an edge of a control region 360 of the superconducting qubit 354 on the first chip 302 are identified by respective dashed outlines.

The second chip 304 includes a readout device 362, which includes an electrically coupled pad element 364 and a resonator element 366. The pad element 364 includes a cross-shape superconductor pad aligned over the center of the superconducting qubit 354. As depicted in FIG. 3C, the pad element 364 is shown as a transparent cross-shape outline aligned within the dashed outline of the readout region 356, however, the interior portion of the cross-shaped outline is to be understood to be composed of superconductor material. The resonator element 366 includes, e.g., an elongated superconductor co-planar waveguide trace. The resonant frequency/mode of the resonator element 366 is determined, in part, by its length and effective permittivity.

To conserve space on the second chip 304, the resonator element 366 is arranged in a serpentine-like shape.

The second chip 304 additionally includes a first control element 368 which overlaps the SQUID region 358 of the superconducting qubit 354 on the first chip 302, when the first chip 302 and the second chip 304 are aligned and bonded together (e.g., by bump bonds 306). The first control element 368 is depicted in FIG. 3C such that the superconductor layer (e.g., aluminum) of the first control element 368 is transparent, and the outline of the first control element 368 (e.g., regions where the superconductor material has been removed and the substrate is exposed) is depicted in black. Further details of the first control element 368 is discussed with reference to FIGS. 5A and 5C below.

The second chip 304 further includes a second control element 370 which overlaps the recessed region 361 of the superconducting qubit 354 on the first chip 302 when the first chip 302 and the second chip 304 are aligned and bonded together (e.g., by bump bonds 306). The second control element 370 is depicted in FIG. 3C such that the superconductor layer (e.g., aluminum) of the second control element 370 is transparent, and the outline of the second control element 370 (e.g., regions where the superconductor material has been removed and the substrate is exposed) is depicted in black. Further details of the second control element 370 is discussed with reference to FIGS. 6A and 6C below.

Figure 4A:
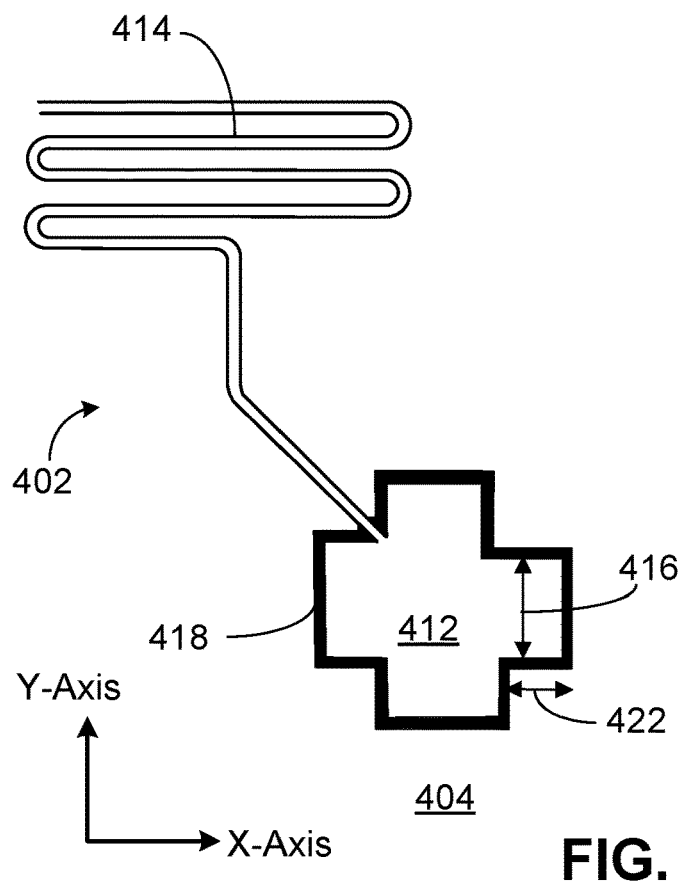
FIG. 4A is a schematic illustrating a top-view of a readout device formed on a second chip.

FIG. 4A is a schematic illustrating a top-view of an exemplary readout device 402, formed on a second chip 404 of a stacked quantum computing device and that will face the first chip (e.g., first chip 410 shown in FIG. 4B) when the first chip and the second chip are bonded together. White areas in FIG. 4A correspond to regions where at least a layer superconductor material is present, whereas grey/black areas correspond to regions where there is an absence of superconductor material and where the substrate may be exposed. Readout device 402 (corresponding to the elements within the dashed line region shown in FIG. 4A) includes, e.g., a pad element 412 and a resonator element 414, and can be made of a superconductor material (e.g., aluminum). An example of readout device 414 includes a quarter-wave co-planar waveguide resonator.

In some implementations the resonator element 414 is a distributed element resonator or a lumped element resonator, such as a co-planar waveguide resonator formed from superconductor material (e.g., aluminum) where the frequency of the resonator is determined in part by the resonator length.

Figure 4B:
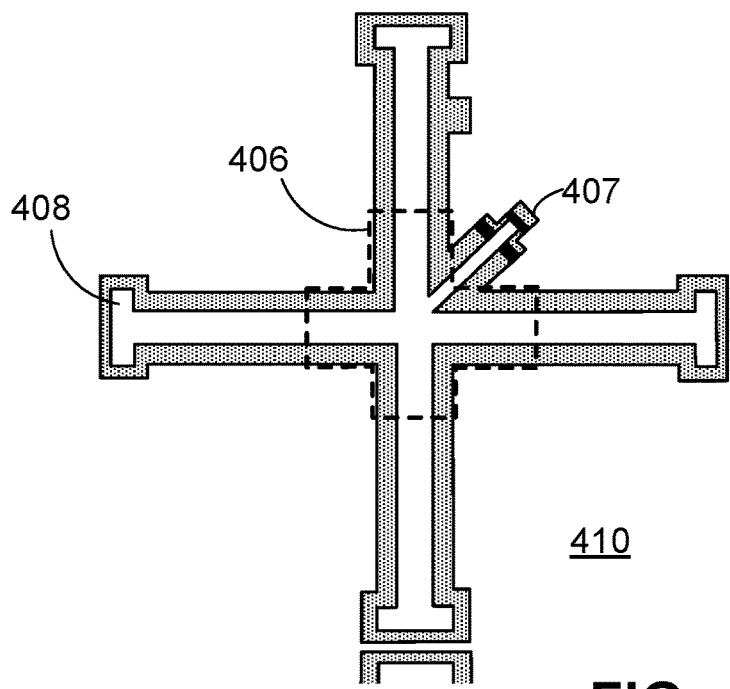
FIG. 4B is a schematic illustrating a top-view of a readout region of a superconducting qubit formed on a first chip.

During operation of the stacked quantum computing device, the pad element 412 may be electromagnetically coupled (e.g., capacitively coupled) to a superconducting obit (e.g., superconducting qubit 408 in FIG. 4B) on the first chip (e.g., first chip 410 in FIG. 4B), in which the qubit is located directly beneath the pad element 412. The superconducting qubit 408 on the first chip 410 then may be read during operation of the stacked quantum computing device by probing the frequency of the resonator element 414. Pad element 412 can have various surface area geometries, depending in part on the respective shape of the superconducting qubit and an amount of capacitance required. For example, as depicted in FIG. 4B, superconducting qubit 408 is an Xmon style qubit exhibiting a cross-like shape having four long arms, and additionally including a portion of a shorter arm in the upper-right quadrant branching out from the center of the superconducting qubit 408 (e.g., corresponding to the SQUID loop of the superconducting qubit). The pad element 412 shown in FIG. 4A, can be cross-shaped such that when the first chip and the second chip are aligned, the area of the superconducting qubit 408 that is covered by the pad element 412 includes a central portion, a portion of each of the four arms of the superconducting qubit 408. In some implementations a portion of the branch corresponding to the SQUID loop of the superconducting qubit 408 is also covered by the pad element 412. In another example, for a gmon qubit, a pad element may have a square or rectangular shape.

In some implementations, the resonator element 414 and the pad element 412 shown in FIG. 4A are formed from a same layer on the second chip 404. In some implementations the resonator element 414 and the pad element 412 are formed in different layers on the second chip 404.

FIG. 4B is a schematic illustrating a top-view of an exemplary superconducting qubit 408 formed on a first chip 410, in which the first chip 410 is to be bonded to the second chip 404. White areas correspond to regions where superconductor material is present whereas shaded areas correspond to regions where there is an absence of superconductor material and where the substrate may be exposed. The first chip 410 includes a superconducting qubit 408, such as an Xmon qubit, though other types of superconducting qubits may be used instead. In the example shown in FIG. 4B, a readout region 406 of the superconducting qubit 408 corresponds to an area around a center of the superconducting qubit 408, and follows the outline of the central portion of the superconducting qubit 408 including at least a portion of each of the four arms of the superconducting qubit 408. Additionally, in some implementations, a portion of the branch 407 corresponding to a SQUID loop that extends from the center to the upper-right corner of the superconducting qubit 408 is also included in the readout region 406 of the superconducting qubit 408.

Figure 4C:
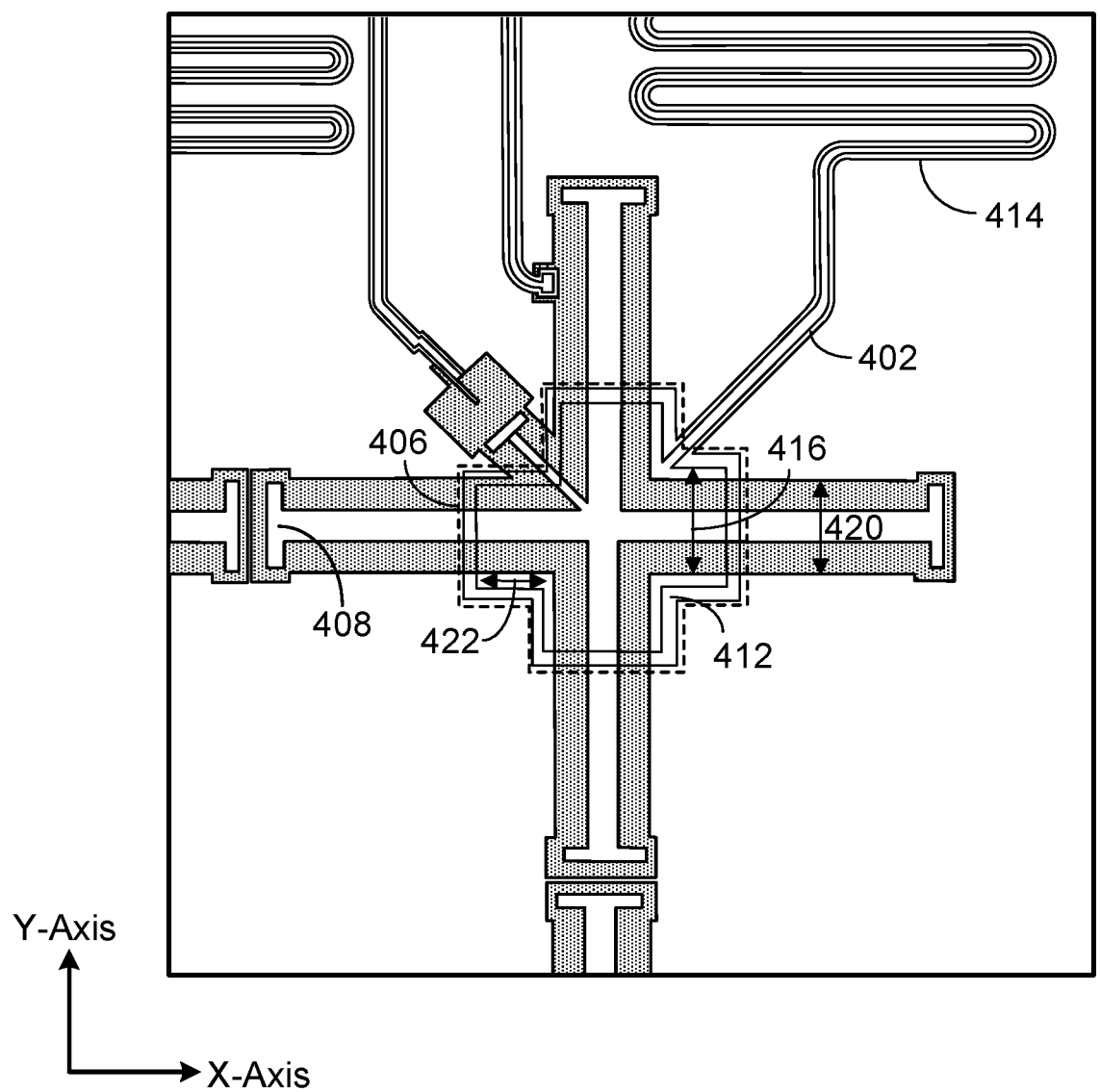
FIG. 4C is a schematic illustrating a top-view through a second chip of a readout device of a second chip aligned over a readout region of a first chip.

FIG. 4C is a schematic that illustrates a top-view through the second chip 410 of a stacked quantum computing device that includes the second chip 410 bonded to the first chip 404 such that outlines of the circuit elements on the first chip as aligned with the circuit elements on the second chip are visible. As shown in FIG. 4C, the readout device 402, which includes pad element 412, resonator element 414, is aligned such that the pad element 412 is located directly over the readout region 406 of the superconducting qubit 408 on the first chip 410. In contrast, the resonator element 414 is laterally displaced so that it does not directly overlap the superconducting qubit 408 on the first chip 410. This arrangement can reduce undesired coupling and/or interference between the resonator element 414 and the superconducting qubit 408.

During operation of the stacked quantum computing device, the readout device 402 may be electromagnetically coupled to the portion of the superconducting qubit 408 located in the readout region 406. For example, the pad element 412 may be capacitively coupled to the readout region 406 of the superconducting qubit 408. An amount of capacitance between the pad element 412 and the qubit can vary depending on the relative sizes of the pad element 412 and the qubit 408, the overlap between the two, and the gap distance between the first and second chip. In some implementations, the dimensions of the pad element 412 may be modified to achieve a particular capacitance. For example, the dimensions of the pad element 412 are adjusted to achieve a capacitance between qubit 408 and pad element 412 of between approximately 1 and 50 femtofarads. Other capacitance values are possible as well.

In some implementations, the surface area of the superconducting qubit 406 included in the readout region 406 of the superconducting qubit 408 on the first chip (e.g., the area of the superconducting qubit 408 that is within the dashed outline depicted in FIG. 4C) that faces the pad element 412 on the second chip is less than the surface area of the pad element 412 facing the first chip. For example, one or more dimensions (e.g., width 416) of one or more respective arms of the cross-shaped pad element 412 may be enlarged to allow for a misalignment between the bonded first chip and second chip. That is, even if there is slight misalignment between the first chip and the second chip, the magnitude of mutual coupling between the readout device 402 and the superconducting obit 408 remains substantially the same because the pad element 402 would still be aligned over a same area of the superconducting qubit 408. An example misalignment can include, e.g., a few microns in the v-direction. Thus, adding a few microns to width 416 on the arm of the pad element 412 such that the width is several microns larger than a corresponding width of an arm of the superconducting qubit 408 within the readout region 406 (e.g., width 420) allows for a misalignment of the respective readout region 406 and the superconducting qubit 408 during a bonding process of the first and second chips.

In some implementations, a length (e.g., length 422) of one or more arms of the cross-shaped pad element 412 may be altered to adjust a capacitance between the qubit 408 and the pad element 412. In general, the amount of overlap between the surface area of the pad element 412 and the surface area of the qubit 408 in the readout region 406 dictates in part the capacitance between the qubit 408 and the pad element 412 in the form of parallel plate capacitance.

Figure 5A:
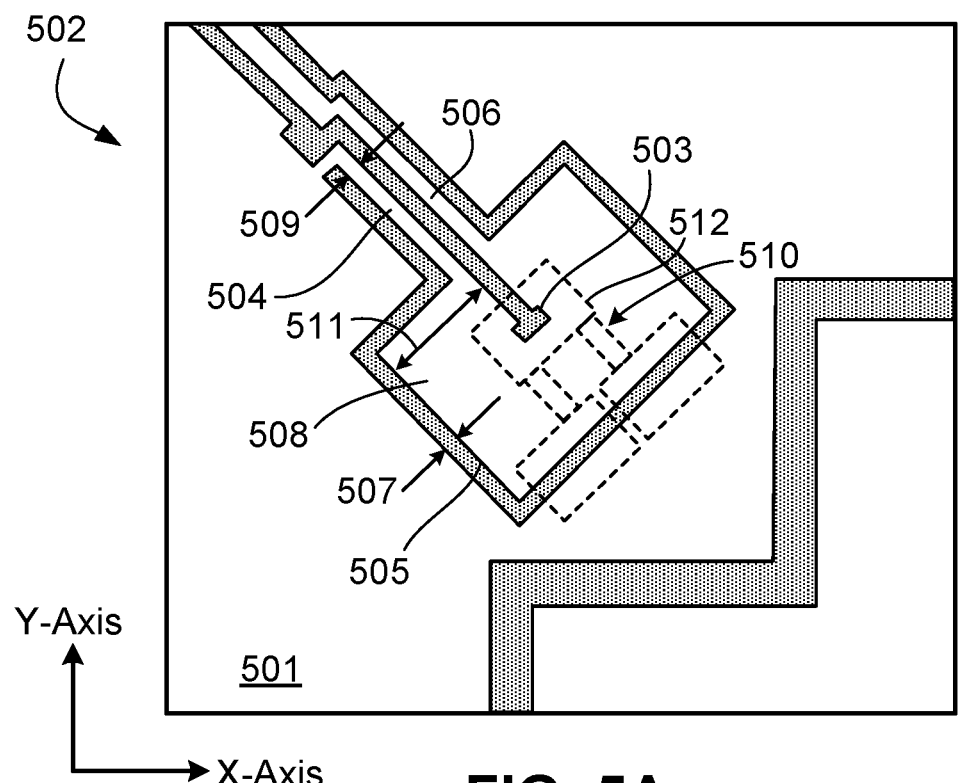
FIG. 5A is a schematic illustrating a top-view of a first control element formed on a second chip.

FIG. 5A is a schematic illustrating a top-view of a first control element 502, such as control element 210 in FIG. 2, formed on a second chip. White areas correspond to regions where there is at least a layer of superconductor material, whereas shaded areas correspond to regions where there is an absence of superconductor material and where the substrate may be exposed. The first control element 502 can include, e.g., a qubit Z-control element. A qubit Z-control element is operable to tune an operating frequency of a superconducting qubit to which the first control element 502 is coupled upon application of a control pulse to the Z-control element. The first control element 502 shown in FIG. 5A includes bias coil formed from a layer of superconductor material arranged on a surface of a substrate. The bias coil formed from a superconductor layer includes a first portion 504 coupled to a ground plane 501, a second portion 506 that, during operation of the stacked quantum computing device, is coupled to a source that provides the control pulse, and a third loop portion 508.

The loop portion 508 of the bias coil includes an inner loop edge 503 and an outer loop edge 505. The outer loop edge 505 is separated from the superconductor ground plane 501 by a gap 507. As shown in FIG. 5A, the width 509 of the superconductor material in first portion 504 and second portion 506 is much narrower than the width 511 of the superconductor material in the loop portion 508. This reduces the footprint of the bias line. To prevent unexpected return currents, ground connections are connected where the bias line is shorted. This may be achieved using bump bonds, such as bump bonds 306 shown in FIG. 3C on either side of the bias line region 390. Inner loop edge 503 and outer loop edge 505 are formed on the second chip such that the inner loop edge is within a SQUID region 510 of a superconducting qubit on a first chip when the first chip and second chip are aligned and bonded together (e.g., the inner loop edge is contained within an inner ring area 512 of the SQUID region 510). Outer loop edge 505 is formed such that the inner ring area 512 of the SQUID region 510 of the superconducting qubit on the first chip is fully contained by the outer loop edge 505 of the loop portion 508 on the second chip when the first chip and the second chip are aligned.

Figure 5B:
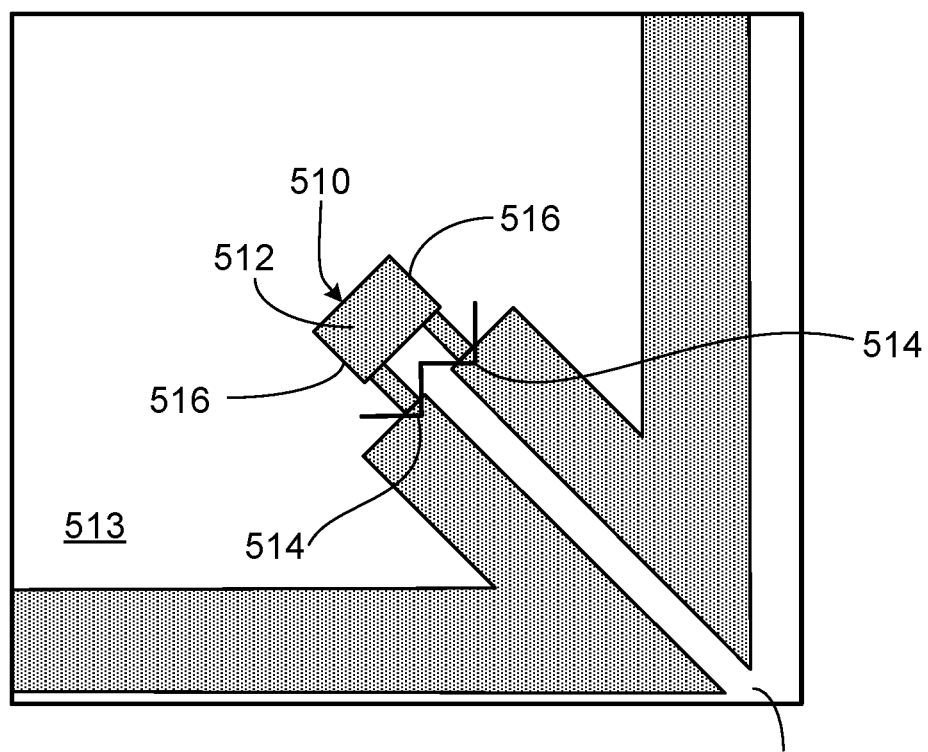
FIG. 5B is a schematic illustrating a top-view of a superconducting quantum interference device (SQUID) region of a superconducting qubit on a first chip.

FIG. 5B is a schematic that illustrates a top-view of an example of a superconducting quantum interference device (SQUID) region 510 of a superconducting qubit, such as the superconducting qubit 206 shown in FIG. 2. White areas correspond to regions where a layer of superconductor material is present, whereas shaded areas correspond to regions where the superconductor material is absent and the substrate of the first chip may be exposed. In the example shown in FIG. 5B, the SQUID within the SQUID region 510 is physically coupled to and extends from a center region of a superconducting qubit. The SQUID region 510 includes a layer of superconductor material arranged in a generally ring shape, in which the superconductor material is interrupted in multiple locations by Josephson junctions 514. The superconductor wires of the Josephson junctions 514 are depicted in black. A portion of the SQUID region 510 may be formed by a superconductor ground plane 513. In the present example, the SQUID region 510 therefore has an inner ring area 512 in which no superconductor is present. The area/perimeter of the inner ring area 512 is defined by the edges 516 of the superconductor material.

When aligning the first chip to the second chip to provide the stacked quantum computing device, the first control element 502 is aligned over the SQUID region 510 of a corresponding qubit. During operation of the stacked quantum computing device, the first control element 502 may be electromagnetically coupled (e.g., inductively coupled) to the SQUID within the SQUID region 510. Upon application of a control pulse to the first control element 502, the inductive coupling allows the operating frequency of the qubit to be tuned. The first control element 502 and the SQUID of the SQUID region 510 are associated with a mutual inductance. For example, the mutual inductance may be between about 0.1 pH to about 100 pH.

Figure 5C:
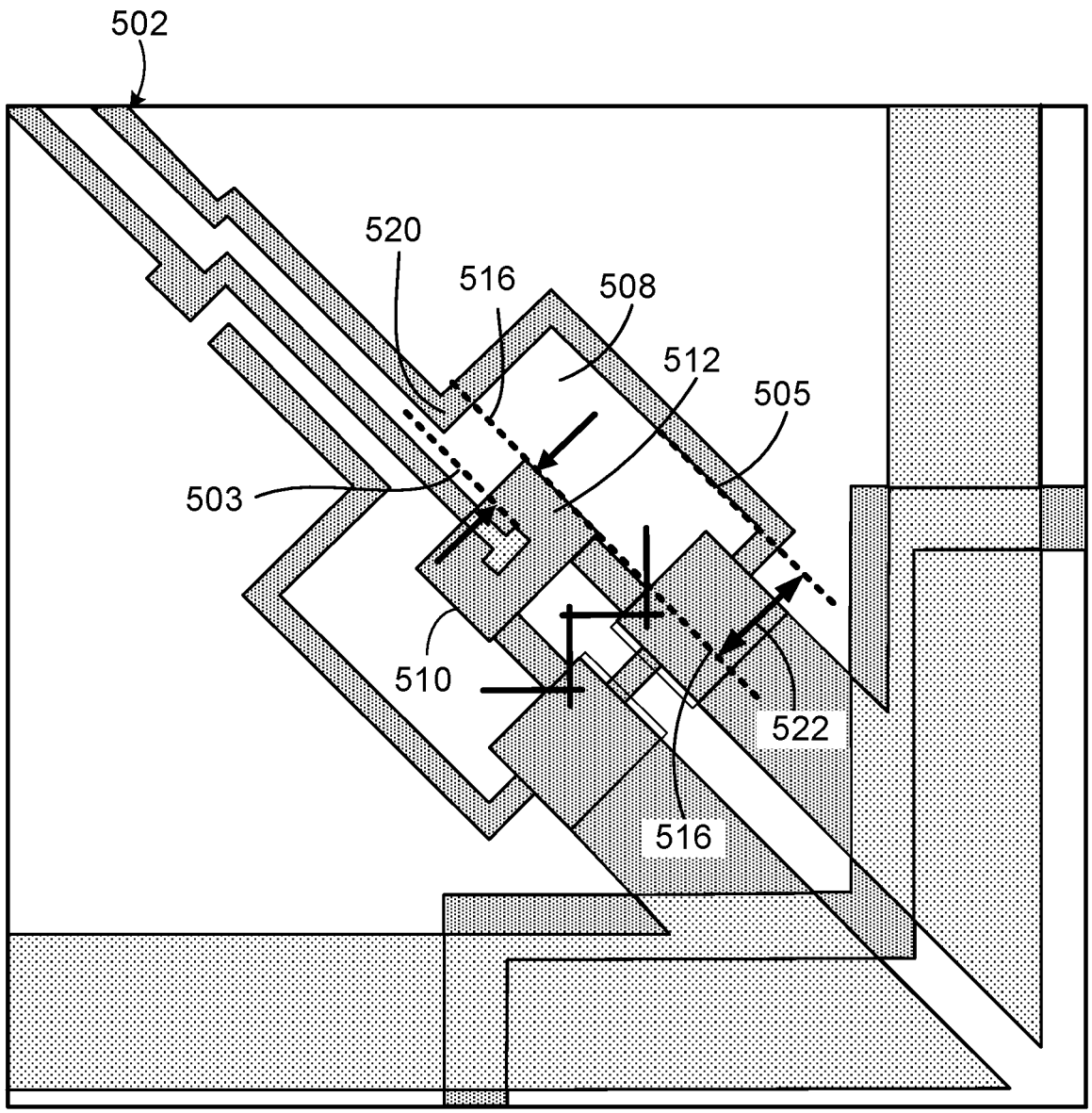
FIG. 5C is a schematic illustrating a top-view through a second chip of a first control element of a second chip aligned over of a SQUID region of a first chip.

FIG. 5C is a schematic that illustrates a top-view of the first control element 502 aligned over the SQUID region 510. In general, for superconductor circuit elements, current flows primarily along the edges of the superconductor layer that forms the circuit element. As a result, variations in the location of the edges of the superconductor material that forms the first control element bias coil 508 relative to the superconductor material the forms the SQUID inner ring area 512 can lead to variations in the desired mutual inductance between the first control element and the SQUID region, as well as increase stray mutual inductance, which can lead to qubit decoherence. Such variations can be due to, e.g., misalignment between the first chip and the second chip during the bonding process.

To achieve high coupling to the SQUID region 510 and reduce stray mutual inductance and to avoid variations in the desired mutual inductance caused by misalignment when bonding, the bias coil 508 of the first control element 502 is kept substantially symmetric. For example, by providing the inner loop portion 503 of the bias coil 508 to have a shape that is symmetric with respect to the outer loop edge 505 of the bias coil 508 (e.g., such that the stray magnetic fields of each are equal and opposite), stray flux from the loop portion 508 cancels itself out through symmetric cancellation, while maintaining high coupling to the SQUID region 510. Furthermore, the SQUID region 510 is located near the ground plane and away from other features of the superconducting qubit (e.g., a readout region or a control region of the superconducting qubit), such that the influence of flux from those other features (e.g., other features excluding the SQUID region 510, or other adjacent superconducting qubits) is reduced.

Additionally, the area of the loop portion 508 of the bias coil is made large relative to the inner ring area 512 of the SQUID region 510 to provide some tolerance for misalignment. That is, when there is misalignment error between the first and second chip, the location of the inner loop edge 503 of the bias coil is likelier to remain located at a position that is directly over the inner ring area 512. Additionally, the location of the outer loop edge 505 is likelier to remain located far from the inner ring area 512, such that stray mutual inductance resulting from current traveling along the outer loop edge 505. For example, a lateral distance between the inner loop edge 503 and an edge 516 of the inner ring area 512 (e.g., lateral distance 520) ranges between about 1 micron to about 10 microns. Additionally, in some implementations, a lateral distance between the edge 516 of the inner ring area and an edge 505 of the outer loop (e.g., lateral distance 522) ranges between about 1 micron to about 20 microns. The range of lateral distances 520 and 522 can depend on an alignment error of the stacked quantum computing device configuration. For example, if the alignment error includes 2 microns of misalignment along the X-axis or Y-axis, the range of lateral distances 520 and 522 can be set to 4 microns.

In some implementations, the inner loop edge 503 and the outer loop edge 505 of the bias coil 508 may be located within the inner ring area 512 when the first chip is aligned and bonded to the second chip. In such cases, the outer loop edge 505 is a lateral distance of at least 2 micron within an edge 516 of the inner ring area 512.

Figure 6A:
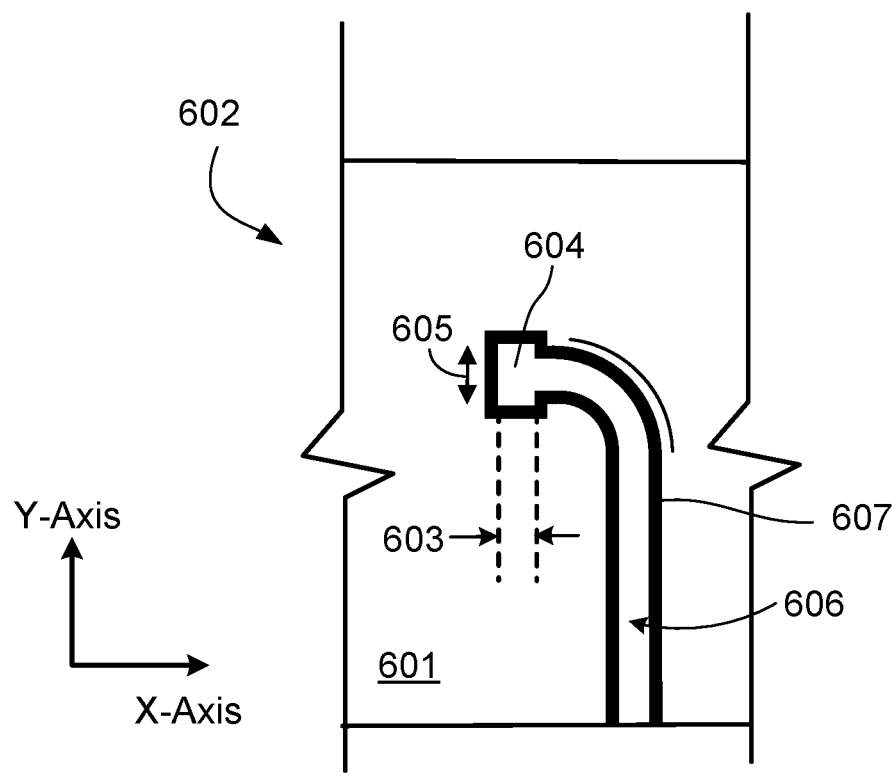
FIG. 6A is a schematic illustrating a top-view of a second control element formed on a second chip.

FIG. 6A is a schematic illustrating a top-view of an example of a second control element 602, such as second control element 212 of FIG. 2, on a second chip. White areas correspond to regions where superconductor material is present whereas shaded areas correspond to regions where there is an absence of superconductor material and where the substrate may be exposed. The second control element 602 can include, e.g., a qubit XY-control element. A superconducting qubit XY-control element is operable to excite a qubit to which the XY-control element is coupled, upon application of a control signal to the XY-control element. The second control element 602 shown in FIG. 6A includes a pad element 604 and a wiring element 606. The pad element 604 is located at an end of a wiring element 606. The wiring element 606 may be coupled to a signal source that provides the control signal to the XY-control element. The pad element 604 and the wiring element 606 are formed in a superconductor layer (e.g., a superconductor thin film) on the second chip, where the pad element 604 and wiring element 606 are separated from the superconductor ground plane 601 through a gap 607 in the superconductor layer (e.g., by exposing the substrate). Pad element 604 includes a pad element length 605 and a pad element width 603.

Figure 6B:
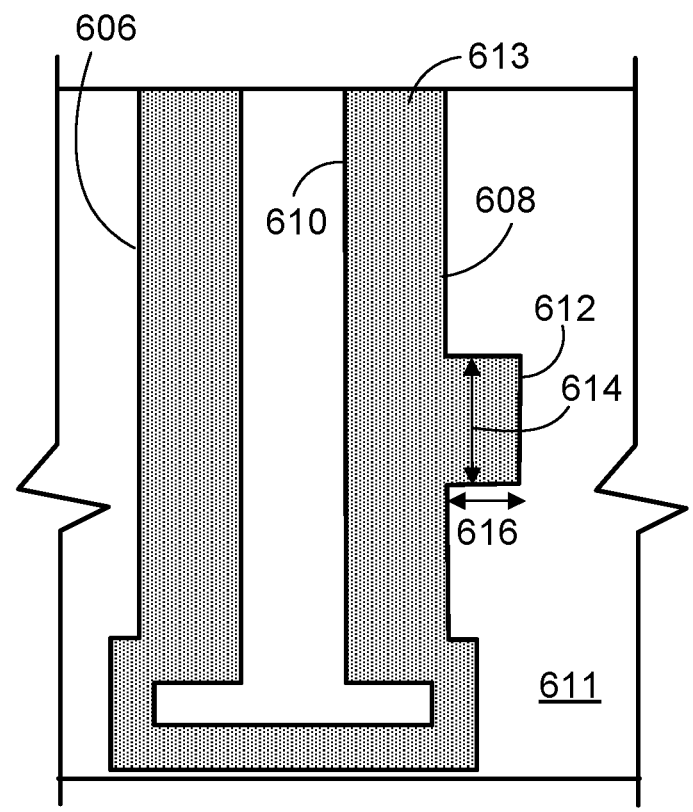
FIG. 6B is a schematic illustrating a top-view of a control region of a superconducting qubit and a recessed region on a first chip.

FIG. 6B is a schematic illustrating a top-view of a control region 606 of a superconducting qubit, such as the superconducting qubit 206 of FIG. 2, on a first chip. In general, the control region of the superconducting qubit includes an area of the superconducting qubit (e.g., a portion of an arm of the superconducting qubit) in which the superconducting qubit on a first chip may be excited by a second control element 602 (e.g., an XY-control element) on the second chip to which the second control element is coupled upon application of a control signal by the second control element 602. In the example where the superconducting qubit is an Xmon qubit type, the control region 606 of the superconducting qubit includes at least a portion of one arm of the superconducting obit.

White areas correspond to regions where superconductor material is present whereas shaded areas correspond to regions where there is an absence of superconductor material and where the substrate may be exposed. Also shown in FIG. 6B is a superconductor ground plane 611. An edge 608 of the ground plane 611 is aligned parallel with an edge 610 of the control region 606, and is separated from the edge 610 by a gap 613 in the superconductor material (e.g., an area where the substrate is exposed). The edge 608 of the ground plane 611 further includes a recessed (or notch or indentation) region 612 where there is an absence of superconductor material and where the substrate may be exposed. Recessed region 612 includes a recessed region length 614 and a recessed region width 616, which can be larger than the pad element length 605 and pad element width 603, respectively.

Figure 6C:
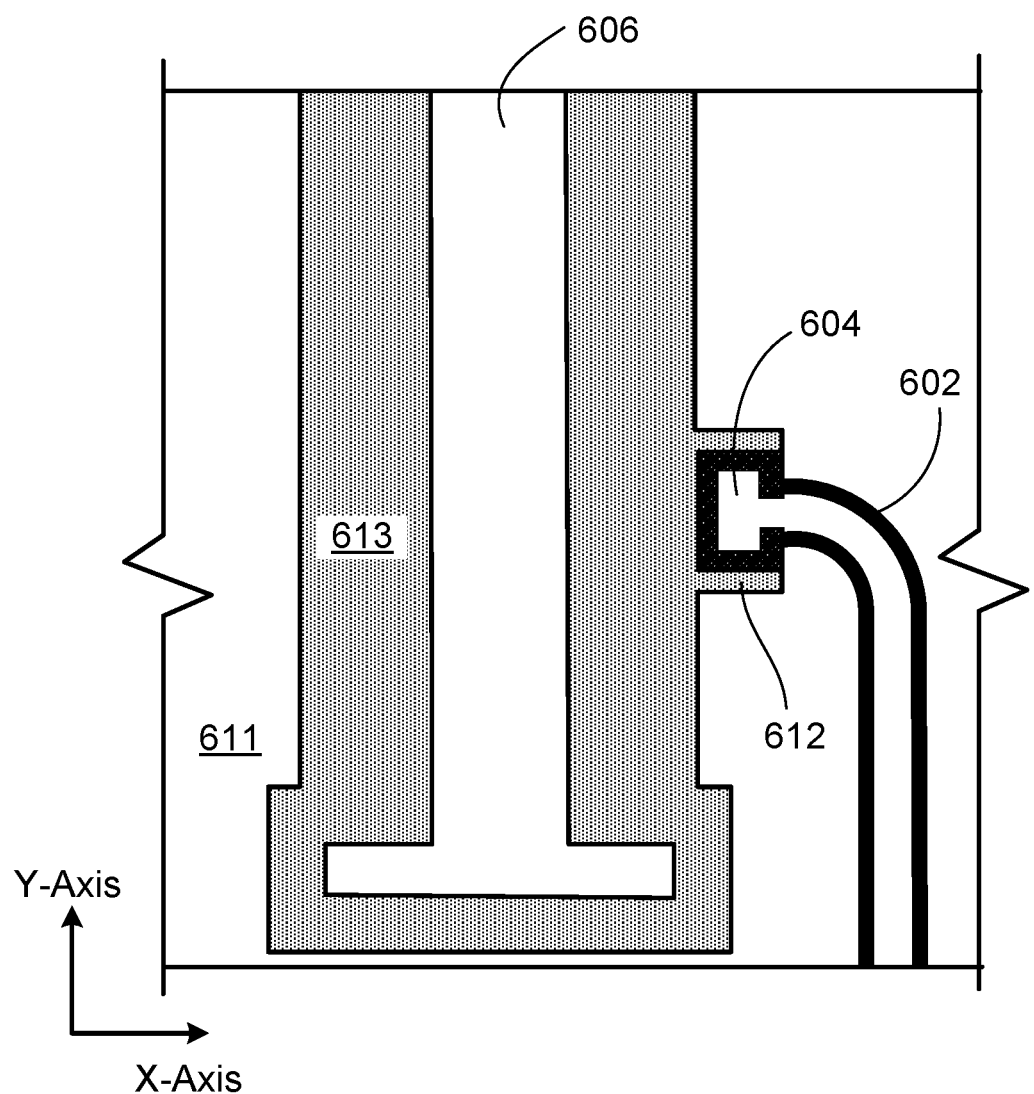
FIG. 6C is a schematic illustrating a top-view through a second chip of a second control element of a second chip aligned over of a recessed region of a first chip.

FIG. 6C is a schematic that illustrates a top-view of the second control element 602 of FIG. 6A aligned over the recessed region 612 of FIG. 6A. The schematic in FIG. 6C also illustrates an outline of the control region 606 of the superconducting qubit adjacent to the recessed region 612 of FIG. 6B and aligned relative to the second control element 602. A ground plane 611 on the first chip also is shown. As shown in FIG. 6C, the pad element 604 of the second control element 602 is displaced laterally from and does not overlap the control region 606 of the superconducting qubit. Rather, the second control element 602 is aligned over the recessed region 612. By laterally displacing the second control element 602 from the control region 606 as shown in FIG. 6C, substantial over-coupling (that may otherwise occur if the second control element 602 were placed directly on or overlapping with the control region 606) can be avoided. With the arrangement shown in FIG. 6C, the second control element 602 and the control region 606 of the superconducting qubit are capacitively coupled by mutual capacitance of the fringing fields between the second control element 602 and the control region 606 of the superconducting qubit. For example, the second control element 602 and the control region 606 of the superconducting qubit have a mutual capacitance of 30 attofarads to achieve control (e.g., XY-control) of the superconducting qubit.

In some implementations, the second control element 602 is aligned to be entirely within the area of the recessed region 612 when the first chip and the second chip are bonded together. The surface area of the recessed region 612 is selected to account for misalignment of the bonding process, such that the edges of the second control element 602 are entirely aligned within the recessed region 612. Furthermore, in some implementations, a total surface area of the second control element 602 facing the first chip (which includes the superconducting qubit) is less than a total surface area of the recessed region 612 facing the second chip that includes the second control element 612. For example, as shown in FIG. 6A, the pad element 604 has a rectangular shape with a length 605 and a width 603 that defines the total surface area of the pad element 604. As shown in FIG. 6B, In the present example, the recessed region 612 has a rectangular shape with a length 614 and a width 616 that defines the total surface area of the recessed region 612. Other shapes may be used instead for the pad element 604 and the recessed region 612. By providing a second control element 602 with a total surface area facing the first chip that is less than a total surface area of the recessed region facing the second chip, it is possible to reduce the stray coupling that may occur due to misalignment.

Figure 7:
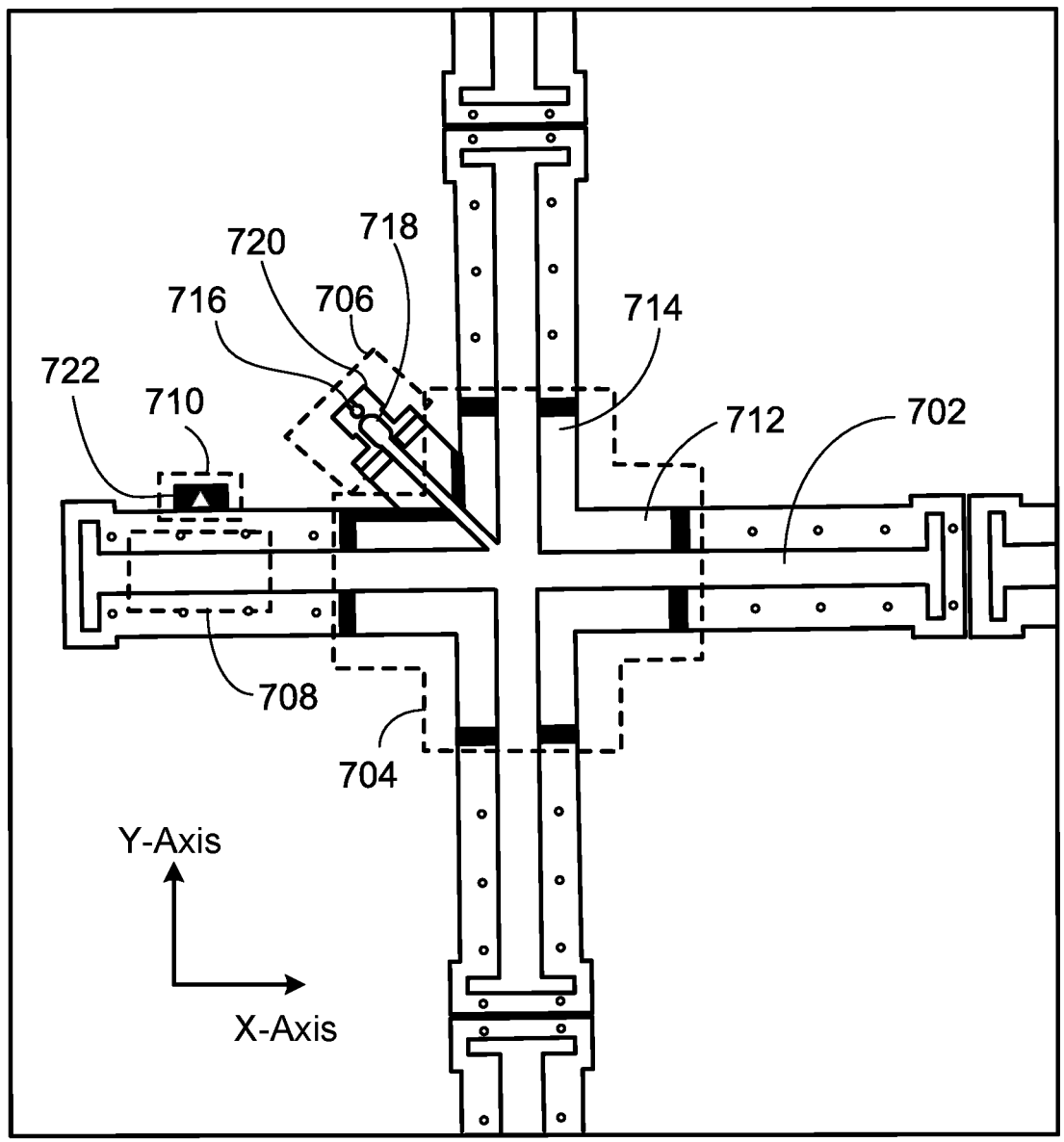
FIG. 7 is an optical micrograph illustrating a top-view through a second chip of a stacked quantum computing device to the first chip.

FIG. 7 is a schematic illustrating a top-view of an exemplary stacked quantum computing device having a first chip (such as chip 202 in FIG. 2) bonded to a second chip (such as chip 204 in FIG. 2). The view is obtained through the first chip, where the superconducting material of the first chip is depicted as transparent. As shown in FIG. 7, an Xmon qubit 702 is provided on the first chip and includes a readout region 704, a SQUID region 706, and a control region 708 of the superconducting qubit 702. A recessed region 710 is formed within an edge of the ground plane that faces the control region 708. A readout device 712 of the second chip is aligned with the readout region 704 of the first chip. For example, a portion of a pad element 714 (e.g., pad element 412) of the readout device 714 is aligned under the readout region 704. Additionally, a loop portion 716 (e.g. inner loop 503) of a bias coil 718 of a first control element 720 (e.g., first control element 502) is aligned within an inner ring area (e.g., inner ring area 512) of the SQUID region 706. Furthermore, a second control element 722 (e.g., control element 602) is aligned within the recessed region 710 such that an edge of the control element is aligned within the recessed region and displaced from the qubit.

A superconducting (alternatively superconductor) material can be understood as material that exhibits superconducting properties at or below a superconducting critical temperature. Examples of superconducting material include aluminum (superconducting critical temperature of 1.2 kelvin) and niobium (superconducting critical temperature of 9.3 kelvin). The superconductor material used to form the devices disclosed herein may have thicknesses in the range of, e.g., about 10 nm to about 1000 nm.

An example of a superconductor material that can be used in the formation of quantum computing circuit elements is aluminum. Aluminum may be used in combination with a dielectric to establish Josephson junctions, which are a common component of quantum computing circuit elements. Examples of quantum computing circuit elements that may be formed with aluminum include circuit elements such as superconductor co-planar waveguides, quantum LC oscillators, cubits (e.g., flux qubits or charge qubits), superconducting quantum interference devices (SQUIDs) (e.g., RF-SQUID or DC-SQUID), inductors, capacitors, transmission lines, ground planes, among others.

For certain circuit elements disclosed herein, such as Josephson junctions, it may be necessary to introduce one or more layers of dielectric material. Such dielectric material layers can be formed to have a thickness in the range of, e.g., about 50 nm and about 2000 nm.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements (e.g., quantum computing circuit elements) include circuit elements used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconductor quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RE-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum computing circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconductor quantum computing circuit elements and/or superconductor classical circuit elements, such as the circuit elements described herein, the superconductor circuit elements are cooled down within a cryostat to temperatures that allow a superconductor material to exhibit superconductor properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Other implementations are within the scope of the following claims.

What is claimed is:

1. A device comprising:
  a first chip comprising a superconducting qubit, the superconducting qubit comprising a superconducting quantum interference device (SQUID) region, a control region and a readout region; and
  a second chip bonded to the first chip, the second chip comprising a first control element directly overlapping the SQUID region, a second control element displaced laterally from and without overlapping the control region, and a readout device directly overlapping the readout region.

2. The device of claim 1, wherein the readout device comprises a resonator element electrically coupled to a pad element, wherein the pad element overlaps the readout region without the resonator element overlapping the readout region.

3. The device of claim 2, wherein the pad element is symmetrically aligned with the readout region of the superconducting qubit.

4. The device of claim 3, wherein the readout region comprises a portion of the superconducting qubit, and a surface area of the portion of the superconducting qubit within the readout region that is facing the second chip is less than a surface area of the pad element facing the first chip.

5. The device of claim 2, wherein the pad element is operable to capacitively couple to a portion of the superconducting qubit within the readout region.

6. The device of claim 1, wherein the first chip comprises a superconductor ground plane having an edge aligned with the control region of the superconducting qubit, wherein the edge comprises a recessed region, and wherein the second control element is aligned over the recessed region.

7. The device of claim 6, wherein a total surface area of the second control element facing the first chip is less than a total surface area of the recessed region facing the second chip.

8. The device of claim 6, wherein the second control element is operable to capacitively couple to the control region.

9. The device of claim 1, wherein the second control element is operable to excite the superconducting qubit.

10. The device of claim 1, wherein the first control element comprises a bias coil, the bias coil comprising a layer of superconductor material arranged in a loop, and wherein the SQUID region comprises a SQUID arranged in a ring.

11. The device of claim 10, wherein the loop comprises an inner loop edge and an outer loop edge, and wherein the inner loop edge is aligned within an inner area of the ring, and the outer loop edge is aligned outside of the inner area of the ring.

12. The device of claim 11, wherein a lateral distance between the inner loop edge and an edge of the ring defining the inner area of the ring is at least 2 microns, and wherein a lateral distance between the outer loop edge and the edge of the ring defining the inner area of the ring is at least approximately 2 microns.

13. The device of claim 10, wherein the loop comprises an inner loop edge and an outer loop edge, and wherein the outer loop edge is aligned within an inner area of the ring.

14. The device of claim 13, wherein a lateral distance between the outer loop edge and an edge of the ring defining the inner area of the ring 1s at least approximately 2 microns.

15. The device of claim 1, wherein the first control element is operable to tune the superconducting qubit.

16. The device of claim 1, wherein the first control element is operable to inductively couple to the SQUID region.

17. The device of claim 1, wherein the first chip is bump bonded to the second chip.

18. The device of claim 1, further comprising a gap between the first chip and the second chip, wherein a height of the gap between the first chip and the second chip is between about 1 micron and about 10 microns.

19. The device of claim 1, wherein the first control element, the second control element, and the readout device comprise superconductor material.

20. The device of claim 1, wherein the superconducting qubit is a transmon qubit, flux qubit, or gmon qubit.

* * * * *